United States Patent [19]

Sullivan

[11] Patent Number: 5,197,673
[45] Date of Patent: Mar. 30, 1993

[54] RECIPROCATING NOZZLE ASSEMBLY

[75] Inventor: William S. Sullivan, Nashua, N.H.

[73] Assignee: Vitronics Corporation, Newmarket, N.H.

[21] Appl. No.: 817,147

[22] Filed: Jan. 6, 1992

[51] Int. Cl.⁵ .............................................. B05B 3/14
[52] U.S. Cl. ................................. 239/102.1; 239/229; 239/264; 118/314; 118/323; 118/326
[58] Field of Search ............... 239/102.1, 229, 225.1, 239/264, 263.1, 263.3; 118/314, 323, 326

[56] References Cited

U.S. PATENT DOCUMENTS

| | | | |
|---|---|---|---|
| 3,650,470 | 3/1972 | Wertman | 239/229 |
| 3,907,204 | 9/1975 | Przystawik | 239/229 |
| 4,340,176 | 7/1982 | Bernard | 239/102.1 |
| 4,728,041 | 3/1988 | Draxler et al. | 239/264 |
| 4,967,962 | 11/1990 | Kawaguchi et al. | 239/102.1 |
| 5,028,003 | 7/1991 | Kasai et al. | 239/102.1 |
| 5,052,617 | 10/1991 | Colclough et al. | 239/102.1 |

FOREIGN PATENT DOCUMENTS

| | | | |
|---|---|---|---|
| 211828 | 10/1957 | Australia | 239/102.1 |
| 660580 | 5/1938 | Fed. Rep. of Germany | 239/102.1 |
| 1155312 | 5/1985 | U.S.S.R. | 239/229 |

Primary Examiner—Andres Kashnikow
Assistant Examiner—Lesley D. Morris
Attorney, Agent, or Firm—Wolf, Greenfield & Sacks

[57] ABSTRACT

A nozzle assembly particularly useful in conveyorized washing or rinsing apparatus. The nozzle assembly of this invention includes nozzles pivotally mounted in a manifold and a motor for producing oscillatory motion thereof. The motor is mechanically coupled to each of the nozzles to pivot the nozzles back and forth through a given angle, preferably in a direction transverse to the direction of movement of products being conveyed. Preferably, the motor is powered by the same fluid sprayed by the nozzles. The nozzles are arranged to produce 100% coverage of the product surface being sprayed as it passes thereunder.

9 Claims, 5 Drawing Sheets

RECIPROCATING NOZZLE ASSEMBLY

FIELD OF THE INVENTION

This invention relates generally to apparatus for spraying a product load using a fluid, and more particularly, to a reciprocating nozzle assembly used with a liquid spraying apparatus.

BACKGROUND OF THE INVENTION

In the fabrication of printed wiring boards and/or printed circuit boards, soldering is the preferred technique for electrically connecting components. Soldering fluxes are first applied to the substrate board material to insure firm, uniform bonding of the solder. While both rosin and non-rosin soldering fluxes are available, rosin fluxes are preferred because they are less corrosive, and have a much longer history of use. Non-rosin, water-soluble fluxes are a more recent development. However, these non-rosin fluxes contain strong acids and/or amine hydrohalides and are thus corrosive, and can cause circuit failure if residual traces are not carefully removed.

Batch-type or underbrush cleaners were initially employed to remove rosin and non-rosin fluxes from printed wiring boards and/or printed circuit boards after soldering. Later, in-line solvent cleaners were adopted to meet demands of increased throughput.

The removal of rosin fluxes from printed circuit boards or printed wiring boards has traditionally been accomplished using chlorinated hydrocarbon and chlorofluorinated solvents, such as 1,1,1,-trichlorethane, trichloromonofluoromethane, methylene chloride, trichlorotrifluoroethane, methyl chloroform, and CFC 113. By the early 1970s, aqueous cleaners using alkaline cleaning compounds, such as the alkanol amines, usually in the form of monoethanolamine, were adopted for rosin flux removal as an alternative to the toxic chlorinated hydrocarbon and chlorofluorinated solvents. These aqueous cleaners chemically react with the rosin flux to form a rosin soap through the process of saponification. Other organic substances, such as surfactants or alcohol derivatives, may be added to these alkaline cleaning compounds to facilitate the removal of such rosin soap. During the past few years, in response to environmental concerns, alternatives have emerged, such as terpene compounds, which are readily biodegradable. An example of such a compound is described in U.S. Pat. No. 4,640,719.

Regardless of which solvent is used, typically the solvent is sprayed onto the printer circuit boards and/or printed wiring boards through some type of a sprayer or nozzle assembly, preferably with sufficient force to dislodge rosin fluxes and to penetrate small spaces between the board and devices mounted thereto. Moreover, especially when terpene compounds are used, after being washed with solvents, the boards must be rinsed, typically with water, to remove the solvents. Water is sprayed onto the boards through some type of sprayer or nozzle assembly, preferably with sufficient force to remove all of the solvents from the board. In both instances, the nozzles or sprayers must cover the entire board with water or solvent. It is also desirable that some of this spray strike the board at an angle with respect to the vertical and with sufficient force, so that water or solvents can penetrate into spaces between the board and devices, and so that fluxes are more readily dislodged.

Existing nozzle or sprayer assemblies typically spray the solvent or water from a nozzle head by passing it through a plurality of holes. These holes distribute the liquid or solvent to provide the desired horizontal coverage, as well as the desired angle of attack of the spray. However, because the nozzle head forces the liquid stream against the perforated barrier which divides the stream into a plurality of smaller streams, the force of the stream is considerably lost, and the velocity of the individual streams striking the board or other device is not optimized.

Typically, apparatus used to wash the boards with a solvent is mounted in an in-line relationship with the soldering apparatus, and a continuously moving conveyor transports the boards from the soldering apparatus and through the washing apparatus from one end to the other. If a rinsing apparatus is also provided it is disposed in an in-line relationship with the washing apparatus. A conveyor transports the boards from the washing apparatus and through the rinsing apparatus from one end to the other. The same conveyor is sometimes used to convey the boards through both the washing and rinsing apparatus.

It is therefore an object of the present invention to provide apparatus for spraying printed circuit boards, printed wiring boards or other like product loads with an optimal, high-velocity stream of liquid.

It is another object of the present invention to provide apparatus for spraying product loads with a liquid spray which forms an angle with respect to the vertical.

It is a further object of the present invention to provide liquid sprayer heads with sufficient horizontal breadth that the entire surface of a product load passing therebeneath is covered with liquid.

It is yet another further object of the present invention to provide such a liquid sprayer configured to be used in apparatus for washing or rinsing printed circuit boards after completion of a soldering operation.

SUMMARY OF THE INVENTION

These and other objects are achieved by the present invention, which relates to a nozzle assembly for use with a fluid spraying apparatus. While this invention has particular applicability to in-line conveyorized washing or rinsing apparatus for solder reflow of surface mounted devices to printed circuit boards, it may also be utilized for other conveyorized or non-conveyorized washing or rinsing apparatus which requires a high-velocity liquid spray, such as batch cleaners.

Applicant has found that the velocity of the stream emitted by a nozzle can be optimized by utilizing a solid-stream nozzle, rather than a nozzle which breaks up the flow of liquid into a large number of small streams or droplets by passing them through a plurality of apertures. Applicant also has discovered that the desired horizontal coverage and angle of attack of a multiple solid-stream nozzle can be achieved with a solid-stream nozzle by reciprocating the nozzle back and forth in a substantially horizontal direction. Preferably, the nozzle is reciprocated in a direction transverse to the direction of movement of a product load through the washing assembly, or through the rinsing assembly. The desired horizontal coverage typically is achieved using a plurality of overlapping, oscillating nozzles.

Preferably, groups of nozzles are oscillated mechanically in unison in a direction transverse to the direction of movement of product load through the washing system or rinsing system. This oscillatory movement is produced by deflecting the tips of the nozzles back and forth. In one embodiment, the nozzles protrude from a manifold, and the nozzle tips in each group are each engaged by an actuator which deflects the nozzle tips to produce the desired oscillatory motion thereof. In a preferred embodiment, the nozzle tips comprise an upper ball portion, which under the force of the liquid, seats in a correspondingly formed depression in communication with the nozzle manifold. The nozzle tips protrude through an aperture which is sufficiently large to permit oscillatory movement of the nozzle tips.

A motor drives the nozzle actuators to product the desired oscillatory motion. This motor may be separately powered, or, in a preferred embodiment, to minimize the energy requirements of the system, and to simplify the apparatus, the motor driving the nozzle actuators is powered by the fluid utilized in the washing or rinsing process. In the preferred embodiment, a rotor disposed in a fluid cavity is rotated by the fluid stream. A link mounted eccentrically on the shaft of the rotor produces an oscillatory motion which is transmitted by mechanical linkages to each of the nozzle actuators. In this embodiment, the oscillatory rate can be adjusted by regulating the flow of liquid into the rotor cavity. The angle through which the nozzle tips oscillate may be regulated by adjusting the length of the mechanical linkages coupling the motor to the associated nozzle actuator.

The apparatus of this invention produces a high-velocity, solid-stream flow through the nozzle which has a greater velocity than most conventional nozzles. The nozzles can be arranged so that through oscillation, the entire surface area being sprayed is covered by the nozzles. The oscillation of the nozzles further allows the liquid stream to strike the device being washed or rinsed at a desired angle to facilitate removal of material, such as solder fluxes, therefrom.

BRIEF DESCRIPTION OF THE DRAWINGS

The objects, advantages and features of this invention will be more clearly appreciated from the following detailed description taken in conjunction with the accompanying drawings in which.

DETAILED DESCRIPTION OF THE PREFERRED EMBODIMENTS

With reference now to the drawings and, more particularly, to FIG. 1 thereof, the nozzle assembly of this invention will now be described. The nozzle assembly of this invention has applicability to conveyorized washing or rinsing apparatus, particularly apparatus used to wash or rinse rosin solder fluxes from printed circuit boards after soldering of surface mounted devices thereto. Frequently, such washing or rinsing apparatus is used in an in-line configuration with the solder reflow apparatus. However, it is to be understood, that the apparatus of this invention may also be used with conveyorized or non-conveyorized systems used to wash or rinse other product loads.

Figure 1:
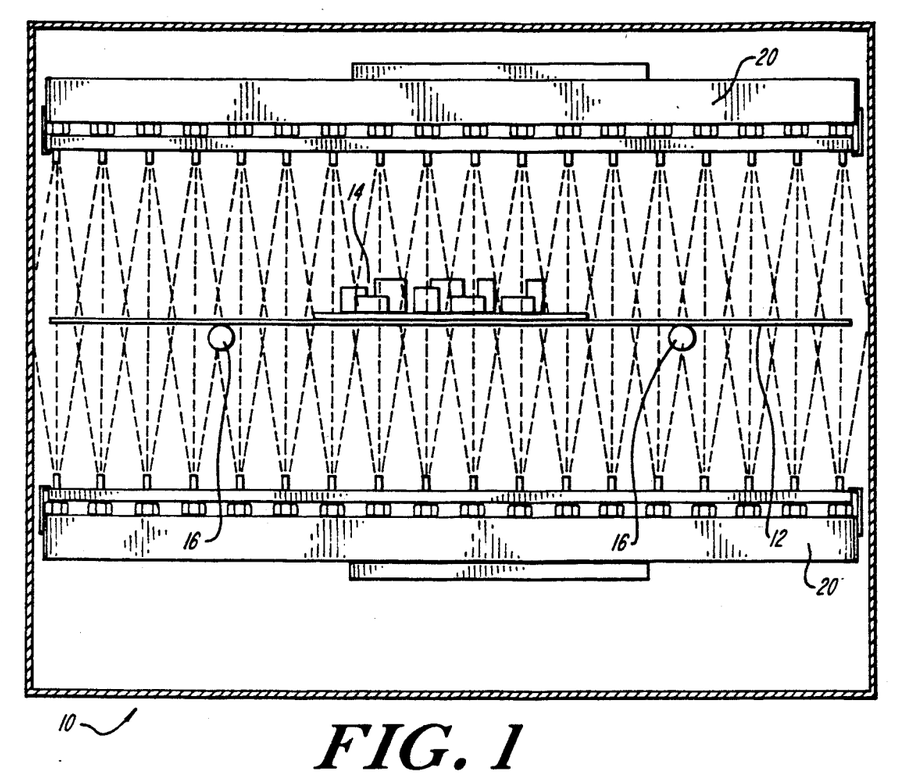
FIG. 1 is an end-view of a schematic diagram of a conveyorized apparatus utilizing the nozzle assembly of this invention.

FIG. 1 is a schematic illustration of a conveyorized washing or rinsing apparatus 10 having a conveyor 12 passing over supports 16 for transporting a product load 14 therethrough. Product load 14 may be, e.g. a printed circuit board, having devices soldered thereto and may have been received from a soldering apparatus (not shown) disposed in-line with apparatus 10. In this instance, apparatus 10 could be used to wash rosin soldering fluxes from printed circuit boards using solvents. Apparatus 10 could also be a rinsing apparatus disposed in-line with a washing apparatus. In this instance, apparatus 10 would be used to rinse solvents from the product load 14, typically with water.

Disposed above, and typically below, conveyor 12 are nozzle assemblies 20 which spray product load 14 with a liquid for either washing or rinsing thereof. While nozzle assembly 20 is shown used in conjunction with a conveyorized washing or rinsing apparatus 10, it is to be understood that the combination of assembly 20 with such a conveyorized apparatus is for purpose of illustration only, and that nozzle assembly 20 can be used with a non-conveyorized apparatus as well.

Nozzle assembly 20 will now be described with particular reference to FIGS. 2-5 Assembly 20 includes one or more nozzle manifolds 22 and 23 and associated nozzle actuators 24, a motor 26, linkages 28 coupling motor 26 to actuators 24, nozzles 30 and housing 32. If nozzle assembly 20 is used with a conveyor 12, manifolds 22 and 23 and associated actuators 24 are preferably disposed transversely of the direction of movement of conveyor 12.

Housing 32 includes a coupling 34 adapted to be connected to a source of fluid. Housing 32 also includes conduits 35 and 37 which provide fluid communication between the opening in coupling 34 and manifolds 22 and 23 respectively to conduct a fluid from the source through coupling 34 into the manifolds 22 and 23. This fluid flow is illustrated by the arrows in FIG. 3. Once the fluid enters manifolds 22 and 23, it is evenly distributed to nozzles 30, as will be described.

It is desirable to render the oscillatory movement of the nozzles as frictionless as possible, to minimize the load on the system, to reduce power requirements, and to avoid any possible jamming or binding of the system. It is also desirable to reduce the mass of the nozzle actuators to as little as possible, to also minimize the system load and potential damage by minimizing their moment of inertia.

As shown in FIGS. 2-5, nozzles 30 each extend from a manifold 22 or 23, and are typically equally spaced from one another. Nozzles 30 are mounted in such a way that they are free to oscillate, yet are retained in their location on manifold 22 and are in fluid communication with the interior of manifold 22.

In a preferred embodiment, the nozzles 30 on each manifold 22 or 23 are oscillated in unison by a nozzle actuator 24 which extends along the length of manifold 22 or 23, and which engages the tips of each nozzle 30 on its associated manifold 22 or 23. Actuator 24 preferably comprises an elongated base 38 and a pair of similarly elongated wings 36 extending at an angle from either side of base 38. Actuator 24 is typically thin and lightweight, but possesses sufficient structural strength not to buckle under the force required to produce the oscillatory movement of nozzles 30. Structural strength is provided by wings 36. Base 38 is provided with a plurality of apertures through which the tips of nozzles 30 project. Typically, each aperture 40 is just large enough to accommodate the tip of the nozzle 30, thereby maintaining tight engagement of the tips and control over movement of the nozzle tips. Each actuator 24 is typically secured to its associated manifold 22 or 23 at each end by a flexible hinge (not shown). This hinge maintains the proper spacing between actuator 24 and manifold 22 or 23, and prevents the actuator from separating from the manifold or from becoming disengaged from the nozzles.

Each actuator 24 is coupled to motor 26 at a point intermediate its ends by linkages 28. Each linkage 28 comprises an arm 42 and an arm 44. Arm 42 is pivotally mounted to housing 32 at central pivot 50 which is located at about the center of arm 42. Arm 44 extends from shaft 46 of motor 26 to arm 42, and is journaled at one end to shaft 46 in an eccentric or offset relation therewith. Arm 44 is pivotally mounted at its opposite end to arm 42 at pivot 48 which is disposed intermediate pivot 50 and one of actuators 24. An enlarged hole is provided for pivot 48 for lateral adjustment of pivot 48 with respect to arm 42. The position of pivot 48 may be adjusted by loosening a screw or the like (not shown) and sliding pivot 48 to a different position within the hole. Such adjustment allows the user to set the travel limits of each actuator 24 to maintain the oscillations of nozzles 30 within desired limits. It is readily apparent that rotation of shaft 46 of motor 26 produces circular movement of the end of arm 44 connected to shaft 46 which oscillates arm 44 in a direction generally parallel to its length which in turn causes arm 42 to pivot back and forth about pivot 50 in a regular cycle. This pivoting of arm 42 produces linear oscillatory movement of actuators 24 in a direction parallel to their lengths. Actuator 24 associated with manifold 22 moves in a direction opposite of the actuator 24 associated with manifold 23, but preferably it moves an equal amount. However, if pivot 50 is offset from the center between manifolds 22 and 23, actuators 24 would move unequal distances. This oscillatory movement of actuators 24 in turn causes the nozzles 30 to reciprocate back and forth in a regular cycle.

Figure 7:
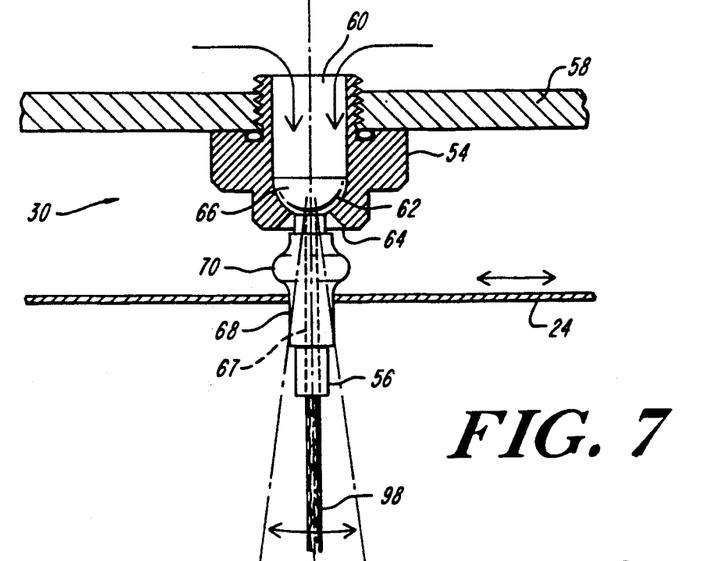
FIG. 7 is a partial, cross-sectional side view of one nozzle of the assembly of FIG. 2.

A preferred embodiment of nozzles 30 will now be described with particular reference to FIG. 7. Each nozzle 30 includes a base 54 and a tip 56. Base 54 is fixedly mounted onto a wall 58 of manifold 22 or 23. A cavity within the interior of base 54 has an opening 60 which is in fluid communication with the interior of manifold 22 or 23. Disposed in the lower portion of the cavity of each base 54 opposite opening 60 is a rounded pocket 62 having an opening 64. Tip 56 includes upper rounded portion 66 and a lower portion 68. Rounded portion 66 is seated in cooperatively formed pocket 62 of base 54 and is free to pivot within pocket 62. The force of fluid entering the cavity within base 54 urges portion 66 into pocket 62 to cause it to seat within pocket 62 to seal opening 64. To the extent that some fluid does penetrate between portion 66 and pocket 62, it acts as a lubricant to facilitate the free movement of tip 56 with respect to base 54. Lower portion 68 of tip 56 extends through opening 64 and through an aperture 40 in nozzle actuator 24. A channel 67 within tip 56 is in fluid communication with the interior of the cavity in base 54. Opening 64 is flared outwardly on a side of base 54 facing actuator 24 to accommodate lateral movement of tip 56, as shown. An enlarged flange 70 is provided on the outer surface of tip 56 to prevent tip 56 from retreating into the cavity in base 54 during periods of inactivity. One embodiment of flange 70 is an O-ring which seats in a groove in tip 56 and which is covered with Teflon ® shrink tubing.

The angle 98 (FIG. 7) subtended by the outer limits of the stream of liquid emitted from tip 56 is a function both of the angle through which tip 56 oscillates back and forth, and the speed of oscillation of tip 56. Obviously, as the angle through which tip 56 oscillates increases, so does angle 98. In addition, as the speed of oscillation is increased, because of the momentum imparted to the fluid emitted by tip 56, the size of angle 98 also increases somewhat.

Figure 2:
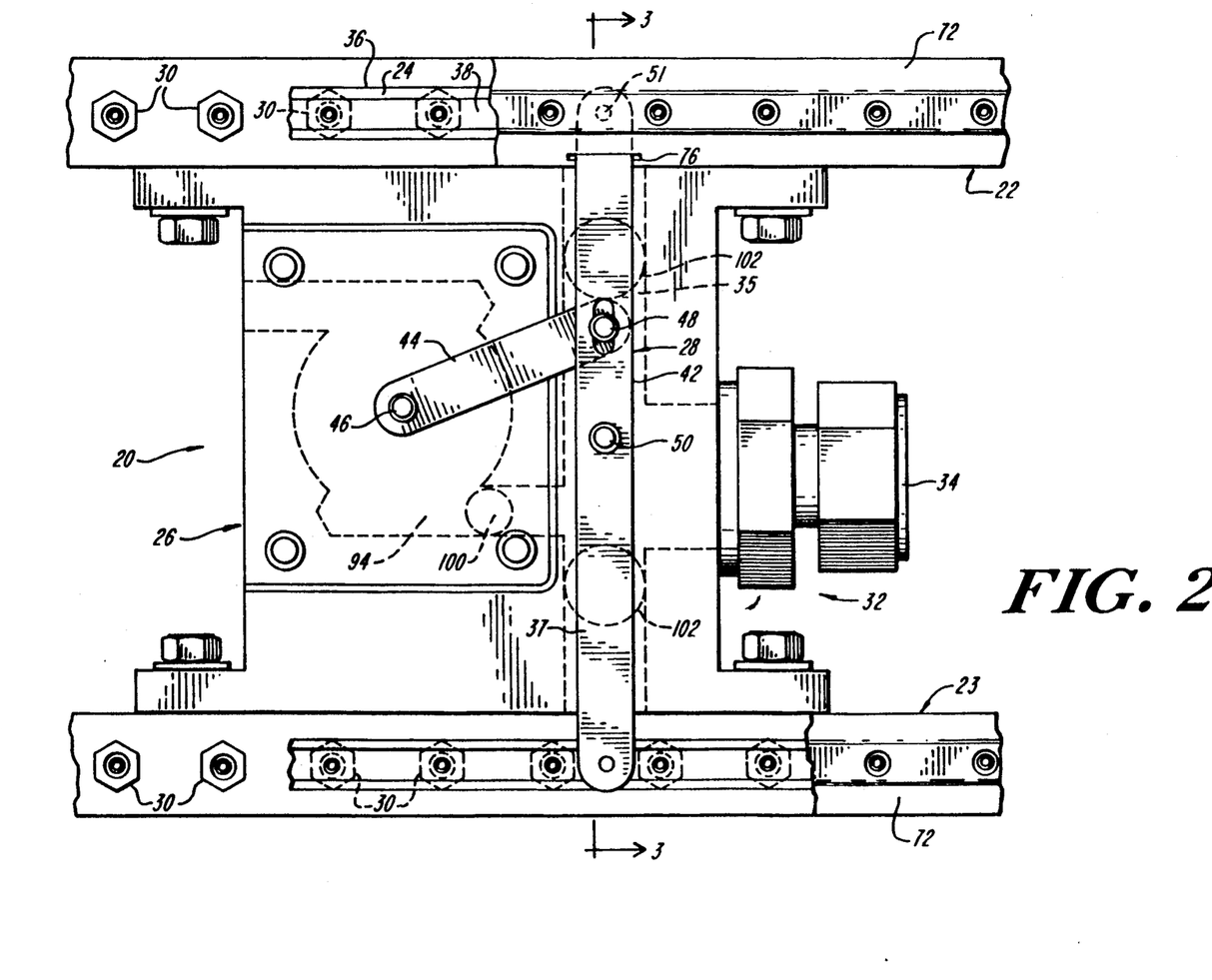
FIG. 2 is a partially cut away, top view of the nozzle assembly of this invention.

The angle through which tip 56 oscillates is determined by a number of factors. These factors include the offset of mount 86 from shaft 46, the distance between pivot 48 and pivot 51 on actuator 24, the distance between pivot 48 and pivot 50, and the distance between pivots 50 and 51. One skilled in the art would understand how to increase the angle through which tip oscillates by increasing the offset of mount 86 from shaft 46 and/or by increasing the distance between pivots 48 and 51 and/or by decreasing the distance between pivots 48 and 50 and/or by increasing the distance between pivots 50 and 51. The speed of oscillation of tip 56 is controlled by the speed of motor 26. In the preferred embodiment, in which motor 26 is powered by the fluid emitted by nozzles 30, the speed of motor 26 is a function of the rate of rotation of rotor 80, which is determined by the amount and velocity of the fluid entering the rotor cavity 92. The flow of fluid into rotor cavity 92 is controlled by a valve 100, as shown in FIG. 2. Valve 100 typically comprises a ballcheck valve which is operated in the usual manner.

In another embodiment, a ballcheck valve 102 may be associated with each manifold 22 or 23. Valves 102 can be manually adjusted as desired. In this manner, the flow rate through each manifold can be varied independently of the other depending upon the particular application. In particular, the spray volume can be varied in the direction of movement of the product load.

Figure 3:
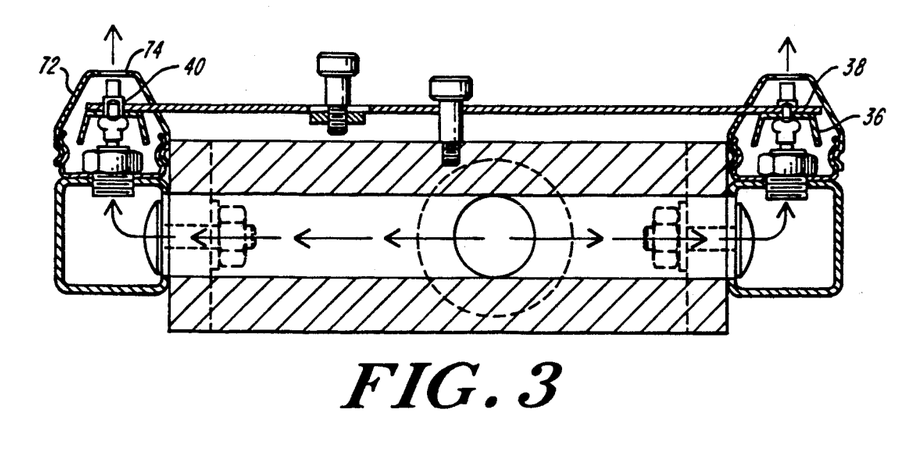
FIG. 3 is a cross-sectional view taken along the line 3—3 of FIG. 2.

In a preferred embodiment, a shroud 72 is associated with each manifold 22 or 23 and covers all of nozzles 30 and actuator 24 associated with that manifold, as shown in FIG. 3. Shroud 72 prevents damage to nozzles 30 or actuator 24 caused by the inadvertent impact of elements of product load 14, or by handling during assembly. Shroud 72 typically is bonded to manifold 22 or 23, as shown. An aperture 74 in shroud 72 is associated with each nozzle 30 to allow the fluid from nozzle 30 to pass therethrough. In addition, a slot 76 is provided on the side of each shroud 72, as shown in FIG. 2, to accommodate arm 42.

Motor 26 may be any conventional motor capable of imparting the desired oscillatory motion to arm 44. Such a motor could be powered electrically o using any other power source. In a preferred embodiment, motor 26 is a fluid powered motor which can be driven by the same fluid which is conducted to manifolds 22 and 23.

Figure 4:
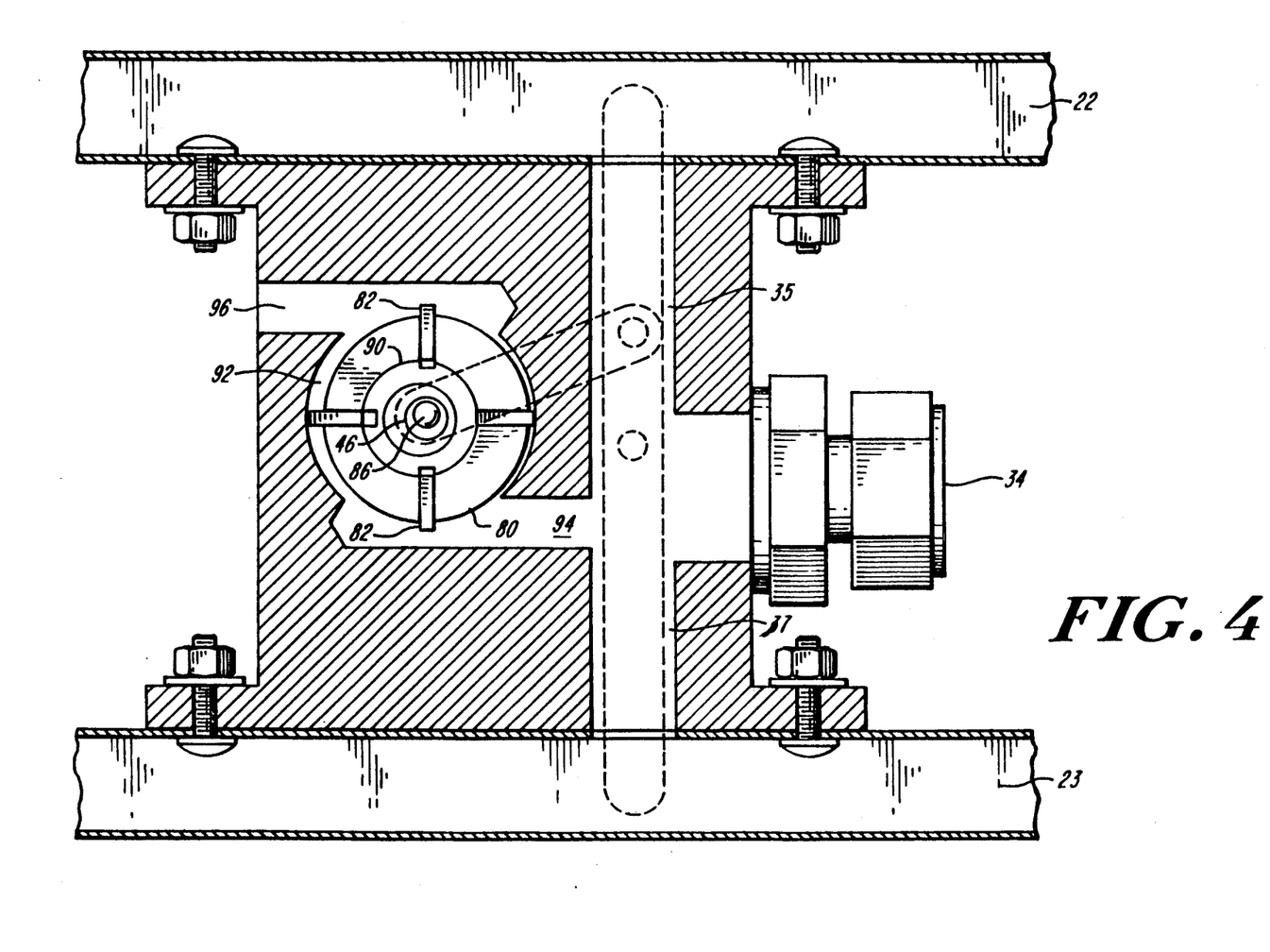
FIG. 4 is a cross-sectional top view of the apparatus of FIG. 3.
Figure 5:
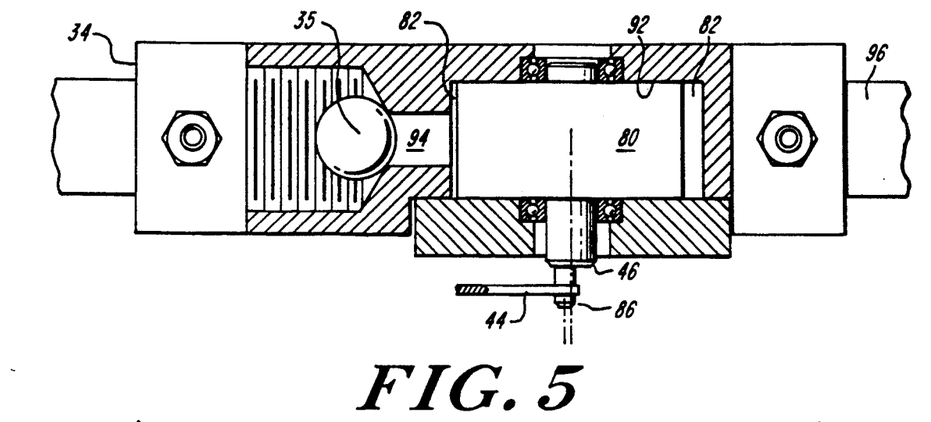
FIG. 5 is a partial cross-sectional view of the rotor housing of the apparatus of FIG. 2.

A preferred, fluid powered motor will now be described, with particular reference to FIG. 4. Motor 26 includes a rotor 80 disposed in a rotor cavity 92, a plurality of vanes 82, a rotor shaft 46, an eccentric mount 86, and a central, resilient washer 90. Rotor shaft 46 is centrally disposed on rotor 80 and is offset with respect to the center of rotor cavity 92. Rotor cavity 92 is in fluid communication with coupling 34 by means of conduit 94. Fluid entering conduit 94 passes into rotor cavity 92 and bears against vanes 82 to urge rotor 80 in a clockwise direction, as shown in FIG. 4. Fluid is exhausted through conduit 96. Washer 90 urges vanes 82 radially outwardly away from rotor shaft 84 against the walls of rotor cavity 92. On the left-hand side of the cavity, as shown in FIG. 4, where there is additional space, vanes 82 are fully extended to allow fluid to impinge thereon. As the rotor continues to rotate, vanes 82 engage the other side of the wall of the rotor cavity 92, as shown on the right-hand side of the drawing in FIG. 4. The closer proximity of the wall urges the vane radially inwardly against the biasing effect of washer 90, which permits rotor 80 to continue to rotate without restriction. This eccentric mounting of rotor 80 permits rotor 80 only to rotate in one direction, and the extended vanes 82 on the left-hand side, as shown in FIG. 4, provided a high torque to rotor 80. Mount 86 is disposed in an offset relation with respect to rotor shaft 46 to produce the desired oscillatory motion of arm 44.

Figure 6:
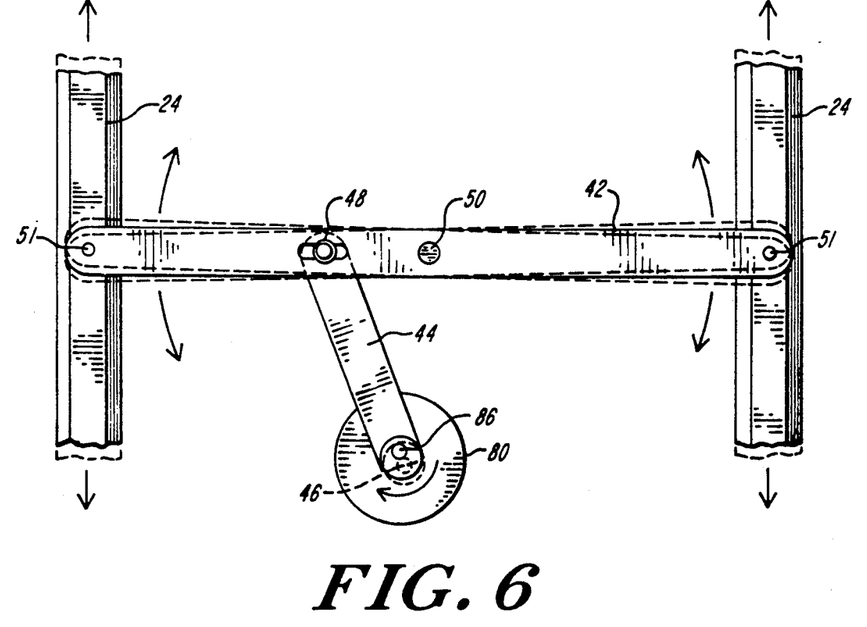
FIG. 6 is a schematic top view showing the operation of the nozzle assembly of FIG. 2.

The operation of the nozzle assembly 10 of this invention will now be described, with particular reference to FIGS. 3, 6 and 7. When it is desired to operate the nozzle assembly 10 of this invention using a washing or rinsing liquid, the liquid is supplied to the apparatus through coupling 34. In the preferred embodiment, as the liquid enters coupling 34, a portion of the flow enters conduit 94, while the remainder of the flow is split in two equal portions which pass through conduits 35 and 37 and enter into respective manifolds 22 and 23. The liquid entering conduit 94 impinges upon vanes 82 producing rotation of rotor 80 in a clockwise direction, as shown in FIG. 4 Because of the eccentric location of mount 86 with respect to shaft 46, rotation of rotor 80 causes arm 44 to oscillate in a direction generally along its length. This oscillation causes arm 42 to pivot alternately clockwise and counterclockwise about pivot 50, as shown in FIG. 2. This alternating pivoting action produces a corresponding linear oscillation of actuators 24 in a direction along their length, one actuator 24 moving in a direction opposite of that of the other actuator 24. Thus, as one actuator 24 is moving left-to-right, as shown in FIG. 2, the other actuator 24 is moving from right-to-left.

At the same time, liquid enters manifolds 22 and 23 and is equally distributed to each of nozzles 30 by manifolds 22 and 23 once the manifold is filled. The liquid entering each nozzle 30 first enters the cavity within base 54 through opening 60. The pressure of the liquid entering the cavity urges portion 66 into pocket 62 so that it seats therein. A solid-stream of liquid passes through channel 67 and is emitted from tip 56, Oscillation of actuator 24, e.g. left-to-right, as shown in FIG. 7, produces corresponding oscillation of each tip 56 associated with that manifold, providing a spray which subtends angle 98, as shown in FIG. 7. The faster the rotation of rotor 80, the greater the angle 98 subtended by the spray, and conversely. The angle through which tip 56 pivots is typically limited by the lengths and arrangements of the elements of linkage 28, as described. The rate of rotation of rotor 80 is controlled using valve 100 which regulates the fluid flow rate into rotor cavity 92. The flow rate of the fluid from pairs of nozzles 30 can be regulated by the use of valves 102.

Figure 8:
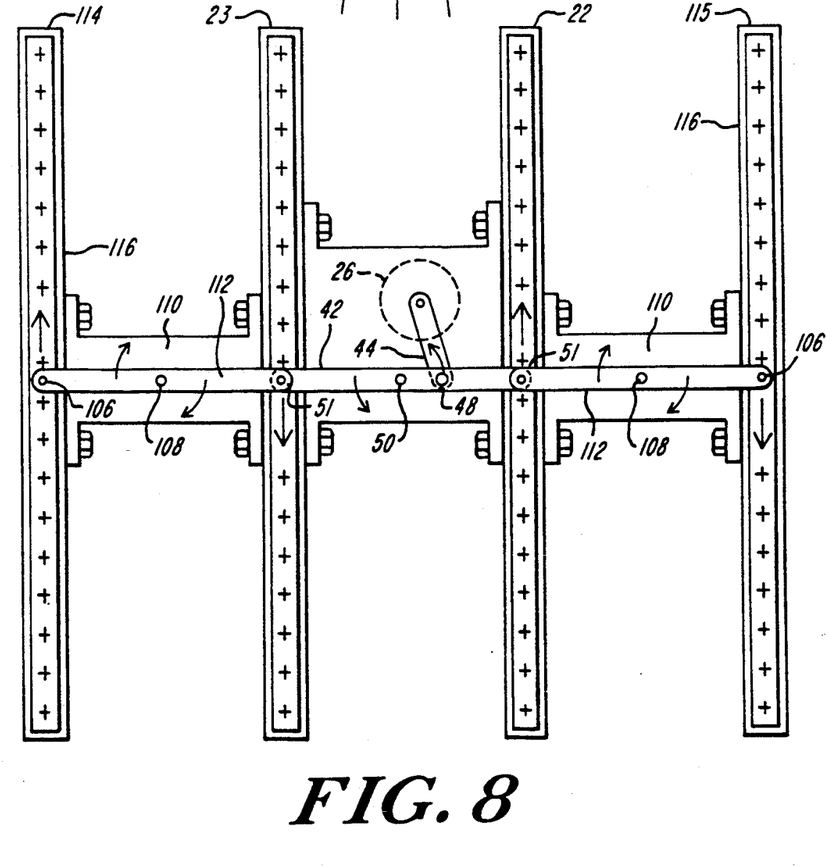
FIG. 8 is a top, schematic view illustrating a four arm nozzle assembly of this invention.

Another embodiment of this invention will now be described with particular reference to FIG. 8. Like numbers will be used for like parts, where possible. The primary difference between the embodiment of FIG. 8 and the embodiment of FIGS. 2–7 is that in the embodiment of FIG. 8, there are four manifolds 22, 23, 114 and 115 instead of just the two manifolds 22 and 23 as shown in FIG. 2. All four manifolds 22, 23, 114 and 115 are driven from the same motor 26. The structure of each manifold 114, 115, 22 and 23 is identical and need not be further described. Each manifold 114, 115, 22 and 23 has associated with it nozzles 30 and associated nozzle actuators 24. Manifolds 114 and 115 are coupled to manifold 22 and 23 respectively by housing mounts 110 which each include (not shown) a fluid conduit which conducts fluid from coupling 34 into manifolds 114 and 115. Each mount 110 has an arm 112 pivotally mounted thereto at pivot 108. Each arm 112 is also pivotally mounted at one end to arm 42 at pivot 51, and is pivotally mounted at its opposite end to an actuator 24 at pivot 106 which is associated with either manifold 114 or manifold 115.

In operation, as motor 26 produces oscillatory motion of arm 44, each of actuators 24 is caused to oscillate back and forth along its length to produce oscillation of associated nozzles 30. For example, as shown in FIG. 8, if arm 44 is withdrawn toward motor 26, rotation of arm 42 in a counterclockwise direction is produced, as shown in FIG. 8. This rotation produces equal and opposite movement of the actuators 24 associated with manifolds 22 and 23 which are disposed on either side of motor 26. This movement produces rotation of both of arms 112 in a clockwise direction, which in turn causes actuators 24 associated with manifolds 114 and 115 to move in opposite directions but over the same distance, as shown in FIG. 8. All of the directions of rotation and movement are reversed when arm 44 oscillates in a direction away from motor 26.

The nozzle assembly of this invention has many advantages over prior art sprayer heads. This invention provides a wide-angle spray as emitted from existing sprayer heads, but the force of the spray per unit area is much greater than in conventional sprayer heads since the stream of liquid emitted from each nozzle 30 is solid. Typically, the force of liquid on the surface of the product load is in the range of 150 to 800 times greater than that found in conventional sprayers. In addition, the oscillatory motion of the nozzle not only permits a wider horizontal coverage, but, because the direction and pressure of the spray varies with time, nozzle 30 provides a better cleansing action for removal of liquids and particles from the product load.

In a preferred embodiment, nozzles 30 pivot through a 16° angle, or ±8° from the vertical. In this embodiment, if a surface is disposed 3¼ inches from the end of tip 56, the path covered by nozzle 30 is one inch wide. Thus, if the nozzles 30 are spaced approximately one inch apart, the entire facing surface of the product load is covered by spray. The rotational speed of the rotor, as previously discussed, determines the oscillatory rate of nozzle actuators 24. Thus, the rotational speed required by the rotor to attain full surface coverage by the nozzles is a function of the speed of conveyor 12, divided by the diameter of the spray emitted by nozzle 30.

Since the nozzles are pivoted to produce the desired coverage, and because the nozzles pivot easily in their seated condition, and because the actuators themselves are formed of a lightweight metal, the invention reduces the inertial effects to a minimum, and requires a minimum amount of force to be applied to produce this oscillation. As a result, a relatively small pumping system is required to attain the liquid impact level sufficient to produce the desired cleaning or rinsing of the product load. Since the dwell time is not a variable in the impact considerations, the nozzle jet can be scanned at high rates with little or no loss of effect.

This invention may be utilized with in-line aqueous cleaners which are used to flush rosin solder fluxes from printed circuit boards after surface mounted devices are soldered thereto. In addition, the nozzle assembly of this invention may be used in conjunction with an in-line rinsing system, which thereafter removes the solvents from the board using water. The nozzle action permits the product load to be impacted with sufficient force to remove the solder fluxes, and allows wicking of the solvent or water into small spaces or crevices in the assembly. This nozzle assembly may also be used with batch cleaners, or it can also be used in conjunction with gaseous flow through a nozzle for drying or cleaning purposes.

In view of the above description, it is likely that modifications and improvements will occur to those skilled in the art which are within the scope of this invention. The above description is intended to be exemplary only, the scope of the invention being defined by the following claims and their equivalents.

What is claimed is:

1. A nozzle assembly for spraying a fluid on a surface comprising:
   a nozzle manifold;
   a plurality of nozzles, each nozzle having a distal tip spaced from said manifold, each of said nozzles including an upper portion securely affixed to said manifold, said tip of each of said nozzles including a ball portion which is adapted to seat in a cooperatively formed internal recess in an associated upper portion of said nozzle upon the application of fluid pressure thereto, each of said nozzle tips being pivotally mounted with respect to said associated upper portion;
   means for engaging each of said nozzle tips; and
   means coupled to said engaging means for producing oscillatory motion of each of said nozzle tips.

2. The nozzle assembly of claim 1, wherein said engaging means comprises a substantially rigid of material having holes, each of said nozzle tips extending through one of said holes of said strip.

3. The nozzle assembly of claim 1, wherein said producing means comprises a motor powered solely by the fluid which is sprayed from said nozzles.

4. A nozzle assembly for spraying a fluid on a surface comprising:
   a nozzle manifold;
   a plurality of nozzles, each nozzle being pivotally mounted in said nozzle manifold and having a distal tip spaced from said manifold;
   means for engaging said tips of each of said nozzles;
   means coupled to said engaging means for producing oscillatory motion of each of said nozzle tips, said producing means comprising a motor powered solely by the fluid which is sprayed from said nozzles;
   means for supplying a fluid to said nozzle assembly;
   a first conduit from said supplying means to said nozzle manifold;
   a second conduit form said supplying means to said motor; and
   means for regulating the supply of fluid to said motor.

5. The nozzle assembly of claim 1 further comprising a plurality of nozzle manifolds, each manifold having an associated plurality of nozzles disposed therein and means for engaging said tips of said nozzles, each of said engaging means being coupled to said producing means.

6. Apparatus for spraying a liquid onto a product load comprising:
   a housing having an inlet and an outlet;
   means for conveying a product load in a direction through said housing from said inlet to said outlet;
   means for spraying with a liquid an entire surface of the product load while disposed on said conveying means within said housing between said inlet and said outlet of said housing, said spraying means comprising:
   a nozzle manifold;
   a plurality of nozzles pivotally mounted in said nozzle manifold and in fluid communication with the interior of said nozzle manifold, said manifold distributing the liquid generally equally to each of said nozzles;
   each of said nozzles having a single opening and producing a single stream of liquid; and
   means for pivoting each of said nozzles alternately in one of two opposed directions, said nozzles being pivoted in directions generally transverse to said direction of movement of said conveying means through said housing.

7. The apparatus for spraying of claim 6, further comprising means for supplying a liquid to said nozzle manifold, said pivoting means comprising a motor powered by liquid received from said supplying means.

8. The apparatus for spraying of claim 6, wherein said pivoting means comprises:
   means for engaging each of said nozzles;
   means for producing oscillatory motion; and
   means for coupling said oscillatory motion-producing means with said engaging means.

9. The apparatus for spraying of claim 6, wherein each of said nozzles comprises:
   an upper portion fixedly mounted to said manifold; and
   a lower portion pivotally disposed with respect to said upper portion, said lower portion having an enlarged ball adapted to seat within a cooperatively formed recess in an interior of said upper portion.

* * * * *